(12) United States Patent
Xue et al.

(10) Patent No.: US 11,611,056 B2
(45) Date of Patent: Mar. 21, 2023

(54) DISPLAY APPARATUS AND METHOD FOR MANUFACTURING THE SAME

(71) Applicant: BOE TECHNOLOGY GROUP CO., LTD., Beijing (CN)

(72) Inventors: Gaolei Xue, Beijing (CN); Xiandong Meng, Beijing (CN); Wei Wang, Beijing (CN); Can Wang, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 98 days.

(21) Appl. No.: 16/863,066

(22) Filed: Apr. 30, 2020

(65) Prior Publication Data
US 2021/0159465 A1   May 27, 2021

(30) Foreign Application Priority Data

Nov. 25, 2019   (CN) .......................... 201911166119.5

(51) Int. Cl.
*H01L 51/52* (2006.01)
*H01L 51/56* (2006.01)

(52) U.S. Cl.
CPC ...... *H01L 51/5275* (2013.01); *H01L 51/5237* (2013.01); *H01L 51/56* (2013.01)

(58) Field of Classification Search
CPC .. H01L 51/5275; H01L 51/5237; H01L 51/56
See application file for complete search history.

(56) References Cited

U.S. PATENT DOCUMENTS

| | | | | |
|---|---|---|---|---|
| 9,818,967 | B2 * | 11/2017 | Ma | .......................... H01L 51/56 |
| 2007/0035849 | A1 * | 2/2007 | Li | .................... H01L 27/14625 |
| | | | | 359/652 |
| 2012/0267650 | A1 * | 10/2012 | Schubert | ................ H01L 33/50 |
| | | | | 257/89 |
| 2016/0238748 | A1 * | 8/2016 | Lee | ..................... H01L 51/5012 |
| 2020/0119236 | A1 * | 4/2020 | Yang | ................... H01L 27/1214 |
| 2022/0246890 | A1 * | 8/2022 | Sugi | ....................... H05B 33/02 |

FOREIGN PATENT DOCUMENTS

| | | |
|---|---|---|
| CN | 104330840 A | 2/2015 |
| CN | 108987425 A | 12/2018 |
| JP | 2007310253 A  * | 11/2007 |
| PL | 194893 B1 | 12/1998 |

OTHER PUBLICATIONS

First Office Action dated Nov. 26, 2020, for corresponding Chinese application 201911166119.5.
Lai, J. et al., "Fabrication of Silicon Diffractive Microlens Array", Semiconductor Optoelectronics, Mar. 2005, vol. 26 Supplement, pp. 106-114.

* cited by examiner

*Primary Examiner* — Matthew E Warren
(74) *Attorney, Agent, or Firm* — Nath, Goldberg & Meyer; Joshua B. Goldberg

(57) ABSTRACT

A display apparatus and a method of manufacturing the same are provided. The display apparatus includes a substrate, and a plurality of display devices, an encapsulation layer, a microlens array and a protective layer which are sequentially provided on the substrate, and the microlens array includes a plurality of microlenses corresponding to the plurality of display devices, and each microlens in the microlens array comprises a multi-step structure including a plurality of steps.

20 Claims, 5 Drawing Sheets

… (US 11,611,056 B2)

DISPLAY APPARATUS AND METHOD FOR MANUFACTURING THE SAME

CROSS-REFERENCE TO RELATED APPLICATION

This application claims the priority from the Chinese Patent Application No. 201911166119.5, filed on Nov. 25, 2019, in the Chinese Intellectual Property Office, the disclosure of which is incorporated herein in its entirety by reference.

TECHNICAL FIELD

The present application relates to a display technology, and particularly, to a display apparatus and a method for manufacturing the same.

BACKGROUND

With continuous development of augmented reality (AR) technology, thinning and lighting of an AR display product based on an optical waveguide has attracted more and more attention from the industry. However, due to a relatively low light efficiency of the optical waveguide, a luminous brightness of a display device is generally required to be greater than 2000 nits to meet display requirements. The luminous brightness of a current display device is generally lower than 1500 nit, which cannot meet the display requirements of the AR display product based on the optical waveguide. At present, a microlens array layer is often provided on the display device to enhance the luminous brightness at a central viewing angle (±9 degrees) of the display device, thereby meeting the display requirements. Microlens with a relatively large size (above tens of microns) are generally manufactured by a laser processing or hot-melt process.

SUMMARY

The present disclosure provides a display apparatus and a method for manufacturing the same.

According to an aspect of the present disclosure, a display apparatus is provided to include a substrate, and a plurality of display devices, an encapsulation layer, a microlens array and a protective layer which are sequentially provided on the substrate, and the microlens array includes a plurality of microlenses corresponding to the plurality of display devices, and each microlens in the microlens array includes a multi-step structure having a plurality of steps.

Optionally, a thickness of the encapsulation layer is equal to a focal length of each of the plurality of microlenses.

Optionally, heights of at least two steps in the multi-step structure are different from each other.

Optionally, heights of the plurality of steps in the multi-step structure monotonously decrease in a direction from a center to an edge of each of the plurality of microlenses.

Optionally, the plurality of display devices each includes a light emitting diode or an organic light emitting diode, and the protective layer is made of a transparent material.

Optionally, the encapsulation layer is made of an organic material.

Optionally, the organic material includes resin or poly methyl methacrylate.

According to another aspect of present disclosure, a method for manufacturing a display apparatus is provided to include:

forming a plurality of display devices on a substrate;

forming an encapsulation layer on the plurality of display devices;

coating an exposure material layer on the encapsulation layer, and dividing the exposure material layer into a plurality of microlens regions corresponding to the plurality of display devices;

dividing each of the plurality of microlens regions into a plurality of sampling regions according to a phase-transform function for the microlens; and forming a multi-step structure including a plurality of steps by performing a patterning process on the plurality of sampling regions in the microlens region, wherein the multi-step structure in the microlens region constitutes a microlens.

Optionally, after forming a multi-step structure including a plurality of steps by performing a patterning process on the plurality of sampling regions in the microlens region, the method further includes:

forming a protective layer on the multi-step structure.

Optionally, a phase difference between a highest point and a lowest point of the multi-step structure is $(2\pi/\lambda)(n1-n0)h$, where $\lambda$ represents a wavelength of an incident light, $n1$ represents a refractive index of the multi-step structure, $n0$ represents a refractive index of the protective layer, and $h$ represents a height of the highest point of the multi-step structure.

Optionally, the patterning process is an overlay lithography process, and forming a multi-step structure including a plurality of steps by performing a patterning process on the plurality of sampling regions in the microlens region includes:

aligning patterns of a plurality of preset mask plates with the plurality of sampling regions in sequence;

exposing, developing, and etching the exposure material layer in each of the plurality of microlens regions to make the plurality of sampling regions into the multi-step structure including the plurality of steps.

Optionally, a relationship between a number of the plurality of preset mask plates and a number of steps in the multi-step structure satisfies: $L=2^n$, where L represents the number of steps in the multi-step structure, and n represents the number of the plurality of preset mask plates.

Optionally, the dividing each of the plurality of microlens regions into a plurality of sampling regions according to a phase-transform function for the microlens includes:

uniformly sampling the microlens region at an equal interval in a row direction and in a column direction, according to the phase-transform function for the microlens, to form the plurality of the sampling regions.

Optionally, the encapsulation layer is made of an organic material.

Optionally, the organic material includes resin or poly methyl methacrylate.

DETAILED DESCRIPTION OF THE EMBODIMENTS

The present disclosure will be described in more detail below with reference to the accompanying drawings and the detailed description of embodiments in order to enable those skilled in the art to better understand the technical solutions of the present disclosure.

The requirements for a resolution of an AR display product in the art are continuously improved, and the requirements for a size of a microlens are also getting higher and higher. For example, as for the microlens with a smaller size of less than 10 microns, use of the laser processing or hot-melt process will make the manufacturing process very complicated, will greatly increase the difficulty in the process, and seriously affect the product yield, thereby increasing the manufacturing cost. Therefore, the laser processing or hot-melt process is no longer suitable for the manufacture of a microlens with a smaller size.

At present, a display product is often provided with a microlens array layer on a display device to enhance the luminous brightness at the central viewing angle (±9 degrees) of the display device, thereby meeting the display requirements. The microlens therein is generally a spherical lens with a smooth surface, which can be manufactured by a laser processing or hot-melt process. However, due to a continuous distribution of respective points on the surface of the current microlens, the diameter or side length of the manufactured microlens is generally tens of microns, and its size is large, which is far from satisfying the requirements of the display product for a microlens with a smaller size (below 10 microns). The embodiments of the present disclosure provide a display apparatus and a method for manufacturing the display apparatus, and the present disclosure will be described in more detail below with reference to the drawings and the detailed description of the embodiment.

Figure 1:
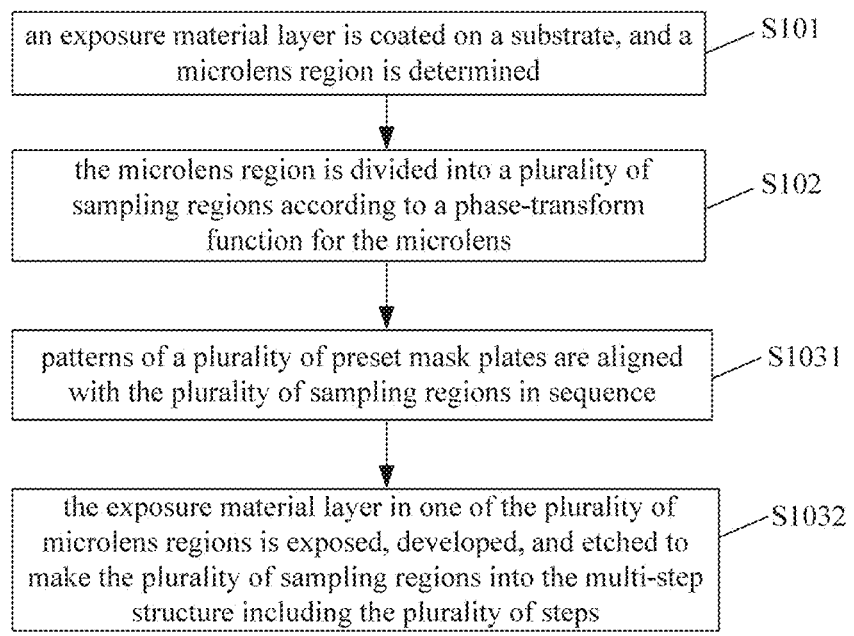
FIG. 1 is a schematic flowchart of a method for manufacturing a microlens according to an embodiment of the present disclosure.

FIG. 1 is a schematic flowchart of a method for manufacturing a microlens according to an embodiment of the present disclosure. As shown in FIG. 1, the method for manufacturing the microlens includes the following steps:

In S101, an exposure material layer is coated on a substrate, and a microlens region is determined.

Figure 2A:
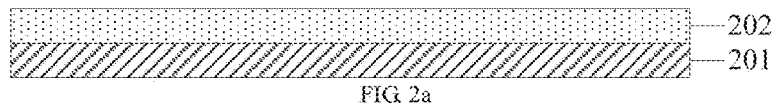
FIGS. 2a to 2c are schematic diagrams illustrating respective steps in the method for manufacturing a microlens according to an embodiment of the present disclosure.
Figure 2B:
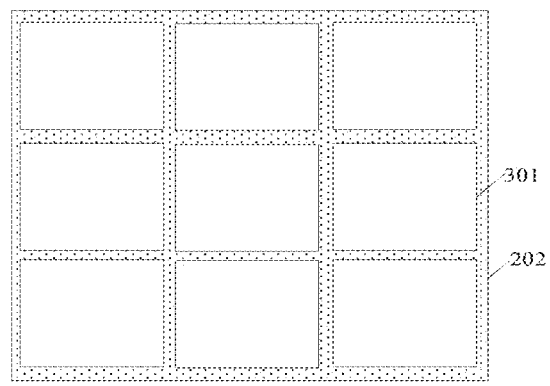

It should be noted that, in the above step S101, as shown in FIG. 2a, an exposure material layer 202 may be coated on a substrate 201, and the exposure material layer 202 may be photoresist or silicon nitride, and the present disclosure is not limited thereto. A preset pattern may be formed on the exposure material layer 202 with light illumination. As shown in FIG. 2b, the entire exposure material layer 202 may be divided into a plurality of microlens regions 301 in advance, and the number of the plurality of microlens regions 301 is equal to the number of microlenses in the microlens array designed in advance. The shape of the microlens region 301 may be circular or square, but it is not limited thereto. For example, the shape of the formed microlens region 301 may be designed according to actual requirements. In the embodiment of the present disclosure, the shape of the microlens region 301 is described as a square, and the formed microlens is a square lens. It can be understood that the manufacturing method according to the embodiments of the present disclosure may be used to manufacture a circular lens or a lens of any other shape, which may be manufactured in a similar way, and the details will not be repeated herein.

In S102, the microlens region is divided into a plurality of sampling regions according to a phase-transform function for the microlens.

Figure 2C:
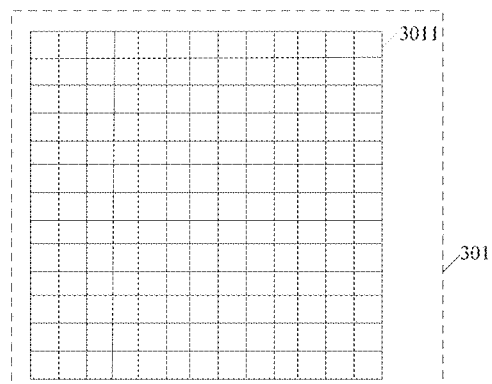

It should be noted that, the phase-transform function is a continuous function, and several discrete points in the phase-transform function can be selected according to the phase-transform function, where the phase-transform function is $e^{i\varphi(x,y)}$ when variables x and y in the phase-transform function take continuous values, it means that the formed microlens is an existing spherical lens with the smooth surface. In the embodiment of the present disclosure, in order to make the formed microlens have a multi-step structure, the variables x and y are valued at an interval according to the phase-transform function. For example, the center of the microlens region 301 can be taken as the center of the circle, an x-axis coordinate and a y-axis coordinate can be established in a row direction and a column direction respectively, and the corresponding plurality of sampling regions 3011 can be formed on the microlens region 301 according to the selected discrete points. The sampling regions 3011 can be evenly distributed, and the interval between two adjacent sampling regions 3011 can be determined by the accuracy of the exposure machine. For convenience of description, one microlens region 301 is taken as an example for description. Specifically, the plurality of sampling regions 3011 as shown in FIG. 2c may be formed in the microlens region 301.

In S103, the plurality of sampling regions is made into a multi-step structure by a patterning process.

It should be noted that, by using the patterning process, the plurality of sampling regions 3011 can be made into the multi-step structure. Heights of at least some of the steps in the multi-step structure may be different from each other, and the multi-step structure in the same microlens region 301 may constitute one microlens. Since the plurality of sampling regions 3011 are discretely distributed according to the phase-transform function, the phase difference between a highest point and a lowest point of the multi-step structure in the same microlens region 3011 may be controlled so that the phase differences among all the steps in the same microlens region 3011 each are within $2\pi$. As such, the size of the entire microlens can be reliably controlled, so as to obtain a microlens with a smaller size.

In the manufacturing method of a microlens array according to the embodiment of the present disclosure, the plurality of discrete sampling regions are sampled on each microlens region according to the phase-transform function, the patterning process is used to make the plurality of discrete sampling regions into a plurality of steps with preset heights, and finally the plurality of microlenses, each of which has the multi-step structure and small size, can be formed. As such, the convergence of light can be enhanced, and the brightness of the light can be improved, so that the display effect of the display product can be improved, and the light brightness of the display product can be satisfied. In addition, the microlens with a smaller size can facilitate the display product to be thinner and lighter, thereby improving the user experience.

Optionally, in the above step S103, the plurality of sampling regions is made into the multi-step structure by using the patterning process, and the patterning process may be an overlay lithography process (or multi-mask photolithography), and may include the following steps:

In S1031: patterns of a plurality of preset mask plates are aligned with the plurality of sampling regions in sequence.

In S1032: the exposure material layer in one of the plurality of microlens regions is exposed, developed, and etched to make the plurality of sampling regions into the multi-step structure including the plurality of steps.

Figure 2D:
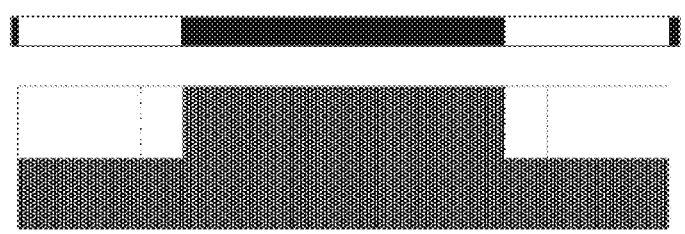
FIGS. 2d to 2f are schematic diagrams illustrating respective steps of a multi-mask photolithograph process according to an embodiment of the present disclosure.
Figure 2E:
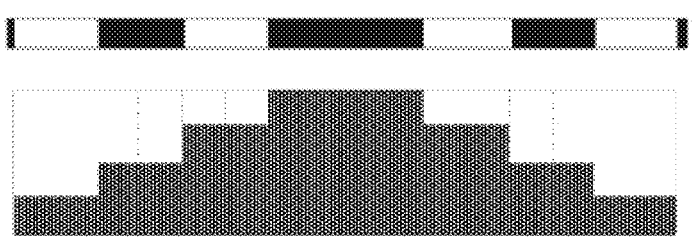
Figure 2F:
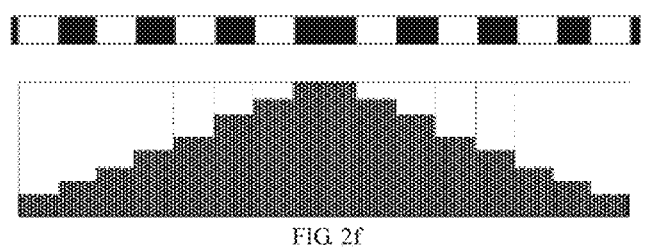

It should be noted that, the number of the steps in the multi-step structure can be designed according to actual requirements, and the plurality of mask plates with different patterns can be designed in advance. The pattern of one of the plurality of preset mask plates is aligned with the sampling region on the exposure material layer each time, and then the exposure material layer is exposed, developed, and etched, and therefore a structure corresponding to the pattern of the mask plate can be formed. This operation can repeated to eventually form the multi-step structure including the plurality of steps with different heights. For example, in some embodiments, three preset mask plates may be used to perform the overlay lithography process on the exposure material layer to form a microlens with eight steps. Specifically, as shown in FIGS. 2d to 2f, after a first mask plate is used to etch the exposure material layer in a first etching, two steps can be formed (see FIG. 2d), and then on the basis of the first etching, a second mask plate is used to etch the exposure material layer in a second etching to form four steps (see FIG. 2e), and finally a third mask plate is used to etch the exposure material again in a third etching to form eight steps (See FIG. 2f), thereby forming a microlens with preset parameters. In the embodiments of the present disclosure, the microlens array is formed by the overlay lithography process, which has high repeatability and is easy to mass-produce. Therefore, the process difficulty in manufacturing the microlens array can be reduced, so that the product yield can be improved, and the manufacturing cost can be reduced.

Optionally, a relationship between the number of the preset mask plates and the number of steps in the multi-step structure in the microlens satisfies: $L=2^n$, where L represents the number of steps in the multi-step structure, and n represents the number of the plurality of preset mask plates.

It should be noted that, in practical applications, three mask plates are generally used to perform the overlay lithography process on the exposure material layer, and a microlens with eight steps can be formed. The formed microlens has a small size, which can meet the display brightness requirements of a display product. Moreover, the number of the mask plates can be saved, and thus the manufacturing cost can be reduced. However, the number of the mask plates according to the embodiments of the present disclosure is not limited to three, and two or more mask plates may be designed as needed.

Figure 2G:
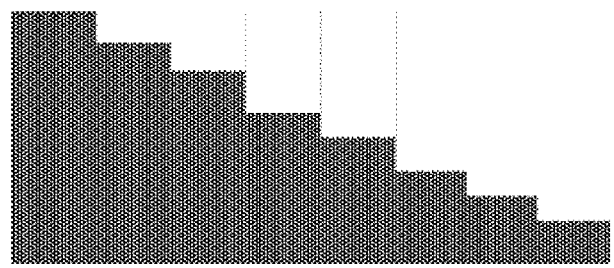
FIG. 2g is a schematic cross-sectional view of a multi-step structure of a microlens according to an embodiment of the present disclosure.
Figure 2H:
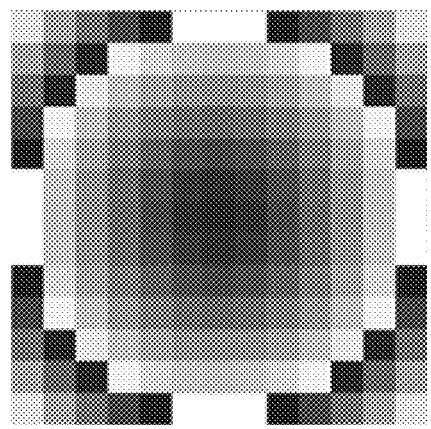
FIG. 2h is a schematic plan view of a multi-step structure of a microlens according to an embodiment of the present disclosure.
Figure 2I:
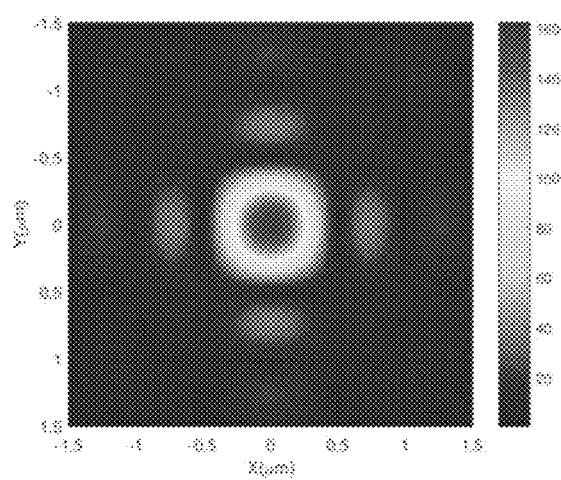
FIG. 2i is a schematic diagram illustrating a light concentrating effect of a microlens according to an embodiment of the present disclosure.
Figure 5:
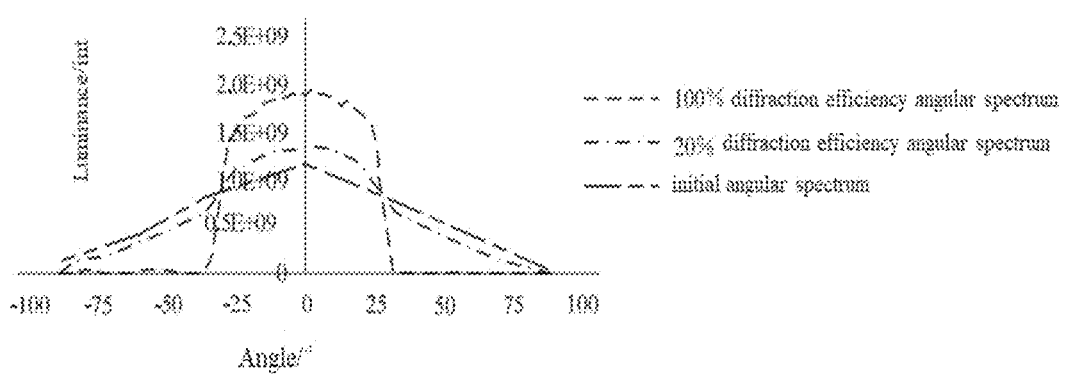
FIG. 5 is a simulation diagram of the light concentrating effect of the microlens according to the embodiment of the present disclosure.

Optionally, FIG. 2g is a schematic cross-sectional structure diagram of a multi-step structure according to the embodiment of the present disclosure. As shown in FIG. 2g, the number of steps in the multi-step structure is eight, and the heights of the steps in the multi-step structure are different from each other, where the highest step is located in a center of the microlens and the lowest step is located on an edge of the microlens. FIG. 2h is a schematic diagram of a planar structure of the multi-step structure according to the embodiment of the present disclosure. As shown in FIG. 2h, the darker the color of the step in the multi-step structure, the higher the corresponding height of the step. The heights of the steps in the multi-step structure monotonously decrease in a direction from the center to the edge of the multi-step structure. It can be understood that, the steps in the multi-step structure of the microlens can also form other shapes with different heights according to the phase-transform function, and the details will not be repeated herein. When light enters from the bottom of each step in the multi-step structure, the step can diffract the light, so that the light passing through the step is deflected in a certain direction, thereby achieving the effect of converging the light, and improving the display brightness. FIG. 2i is a schematic diagram of a light concentrating effect of the microlens according to the embodiment of the present disclosure. As shown in FIG. 2i, the microlens according to the embodiments of the present disclosure can effectively converge a collimated light rays at a focus thereof, so that the brightness of the light can be improved, and thus the display effect of the display product can be improved, thereby meeting the display brightness requirements of the display product. FIG. 5 is a simulation diagram illustrating a light concentrating effect of the microlens according to the embodiment of the present disclosure. As shown in FIG. 5, the focusing efficiency of the microlens with eight steps at the focus according to the embodiment of the present disclosure is about 20%, that is, the diffraction efficiency of the microlens is 20%. In practical applications, after the microlens is integrated into the display apparatus, the luminous brightness of the display device in the display apparatus within ±9 degrees can be increased by about 10%. If the diffraction efficiency of the microlens is adjusted to 100%, the luminous brightness of the display device in the display apparatus within 9 degrees can be increased by about 40%. Therefore, the microlens array manufactured using the manufacturing method according to the embodiments of the present disclosure can effectively converge the light, so that the brightness can be improved.

Optionally, in the above step S103, dividing the microlens region into a plurality of sampling regions according to the phase-transform function includes: uniformly sampling the microlens regions at equal intervals therebetween in a row direction and in a column direction, according to the phase-transform function, to form the plurality of sampling regions.

It should be noted that, the microlens region 301 on the exposure material layer 202 can be uniformly sampled (a sampling interval is determined by the minimum exposure accuracy of the exposure machine) to form a plurality of sampling regions 3011, so as to facilitate aligning the patterns of the mask plates with the sampling regions, which can avoid errors caused by the misalignment of the patterns of the mask plates with the sampling regions during the overlay lithography process.

Based on the same inventive concept, the embodiment of the present disclosure provides a method for manufacturing a display apparatus. The method for manufacturing the display apparatus includes the method for manufacturing the microlens array according to the above embodiment.

Figure 3:
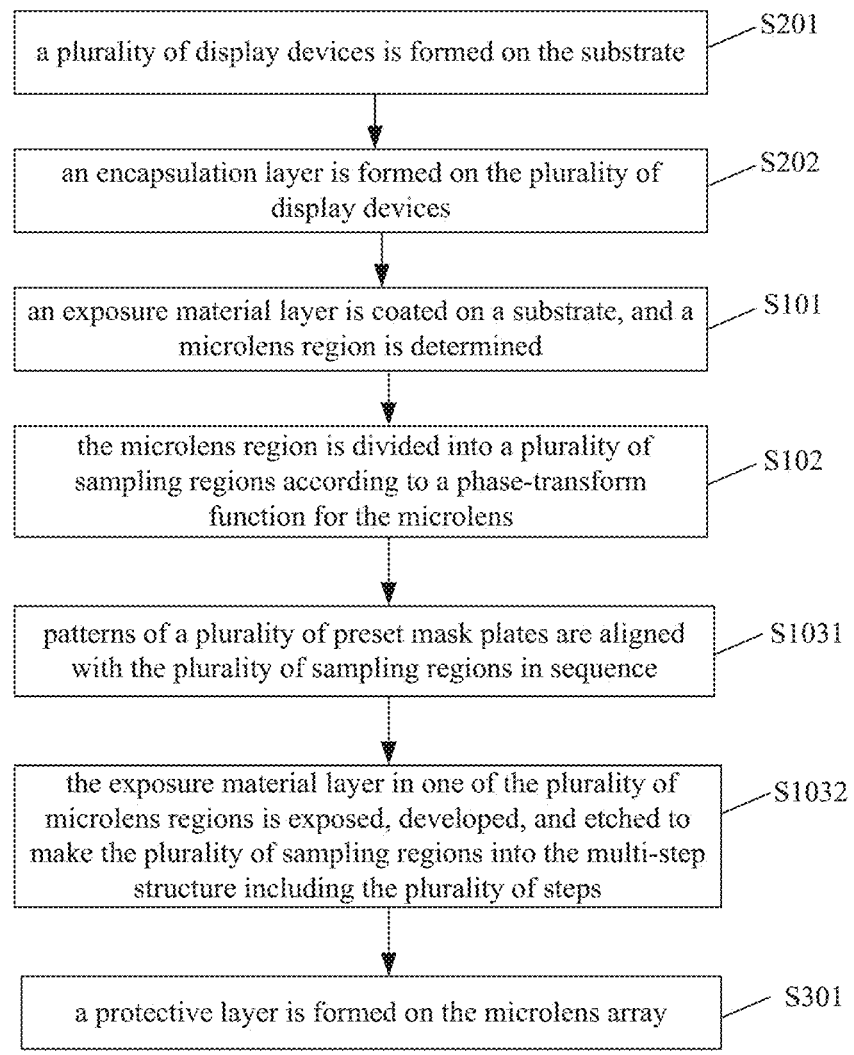
FIG. 3 is a schematic flowchart of a method for manufacturing a display apparatus according to an embodiment of the present disclosure.

FIG. 3 is a schematic flowchart of a method for manufacturing the display apparatus according to the embodiment of the present disclosure. As shown in FIG. 3, before coating an exposure material layer on a substrate as described above, the method for manufacturing the display apparatus further includes the following steps:

In S201, a plurality of display devices is formed on the substrate.

In S202, an encapsulation layer is formed on the plurality of display devices.

Figure 4:
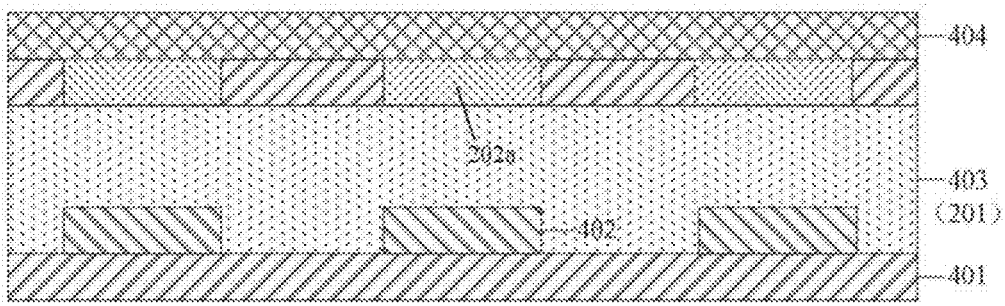
FIG. 4 is a schematic structural diagram of a display apparatus according to an embodiment of the present disclosure.

It should be noted that, as shown in FIG. 4, a plurality of display devices 402 may be formed on a substrate 401, and the display devices 402 may generate light with a certain brightness under the control of a data signal to display a preset picture. An encapsulation layer 403 may be formed on the plurality of display devices 402, and the encapsulation layer 403 may encapsulate each display device 402 to prevent outside water and oxygen from entering the display device 402, thereby avoiding corrosion or short circuit of the circuit structure. The encapsulation layer 403 is made of an organic material. For example, the encapsulation layer 403 may be made of resin, poly methyl methacrylate (PMMA), etc., but the present disclosure is not limited thereto.

Optionally, the display devices 402 correspond to the microlenses 202a one-to-one.

It should be noted that, the display devices 402 can correspond to the microlenses 202a one-to-one, so that the light emitted by the display devices 402 can be directly irradiated into the corresponding microlenses 202a, and the microlenses 202a can converge the light emitted by the display devices 402 to increase the brightness, and thus the display effect of the display product can be improved, thereby meeting the brightness requirements of the display product. For example, the shape and the size of the microlens may be designed according to a shape and a size of a pixel of a display screen.

Optionally, a thickness of the encapsulation layer 403 is equal to a focal length of the microlens 202a.

It should be noted that, the thickness of the encapsulation layer 403 can be equal to the focal length of the microlens, and thus the display device 402 can be located exactly at the focus of the microlens 202a, so that the microlens 202a has the best convergence effect on the light generated by the display device 402, but the present disclosure is not limited thereto. For example, the thickness of the encapsulation layer 403 may also be smaller than the focal length of the microlens 202a, which can reduce the thickness of the film layer while ensuring good convergence. The thickness of the encapsulation layer 403 may be set according to actual requirements. For example, the focal length of the microlens may be designed according to a refractive index and a thickness of each component of the display apparatus, and a center wavelength of a color filter.

Optionally, the substrate 401 includes a silicon substrate, and the display device 402 includes a light emitting diode or an organic light emitting diode.

It should be noted that, the substrate 401 of the display device may be a silicon substrate or any other type substrate such as a glass substrate. The display device 402 may include a light emitting diode or an organic light emitting diode, which may generate light having a certain brightness under the control of a data signal. In addition, the display device 402 may also include a switching device, a driving device, and the like, and has a same light-emitting principle as the organic light-emitting diode in the prior art, and the details will not be repeated herein.

Optionally, the encapsulation layer 403 functions as the substrate 201 of the microlens array.

It should be noted that, the encapsulation layer 403 can encapsulate the display devices 402, and protect the display devices 402 from being damaged to the internal circuit structure by water, oxygen and the like. At the same time, the encapsulation layer 403 may have a certain thickness to provide a space and a distance for the microlenses to converge the light generated by the display devices 402.

Optionally, as shown in FIG. 3, after the multi-step structure is formed on the sampling regions by using the patterning process, the manufacturing method of the display apparatus further includes:

In S301, a protective layer is formed on the microlens array including the plurality of microlenses 202a.

It should be noted that, as shown in FIG. 4, the protective layer 404 may be made of a transparent material (such as glass, etc.), cover each microlens 202a with the multi-step structure, and flatten the surface of the microlens 202a in order to facilitate bonding with other film layers of the display product, and the protective layer 404 can protect the microlens 202a from being damaged by external forces during the manufacturing and use of the display product.

Optionally, a phase difference between a highest point and a lowest point of the multi-step structure is $(2\pi/\lambda)(n1-n0)h$, where $\lambda$ represents a wavelength of an incident light, $n1$ represents a refractive index of the multi-step structure, $n0$ represents a refractive index of the protective layer, and $h$ represents a height of the highest point of the multi-step structure.

It should be noted that, the phase difference between the highest point and the lowest point of the multi-step structure is $(2\pi/\lambda)(n1-n0)h$, and the heights of the steps of the multi-step structure may be designed in advance according to the phase difference between the highest point and the lowest point of the multi-step structure. When the phase difference is $2\lambda$, the height $h$ is $\lambda/(n1-n0)$, from which, it can be seen that the phase difference between the highest point and the lowest point of the multi-step structure in the same microlens region 3011 is within $2\pi$, and thus the height of the step in the multi-step structure is not too high. As such, the size of the microlens can be controlled while achieving the function of converging light.

Based on the same inventive concept, the embodiment of the present disclosure provides a display apparatus including: a substrate, and a plurality of display devices, an encapsulation layer, a microlens array and a protective layer sequentially positioned on the substrate; the microlens array includes a plurality of microlenses corresponding to the plurality of display devices. Each microlens in the microlens array includes a multi-step structure with a plurality of steps. The display apparatus may be formed by using the manufacturing method in the above embodiment, and the structure of the display apparatus is the same as the structure shown in FIG. 4, and the details will not be repeated herein.

It should be understood that, the above embodiments are merely exemplary embodiments adopted for explaining the principle of the present disclosure, but the present disclosure is not limited thereto. It will be apparent to those of ordinary skill in the art that various variations and improvements can be made without departing from the spirit and essence of the present disclosure, and these variations and improvements are also regarded as the protection scope of the present disclosure.

What is claimed is:

1. A display apparatus, comprising a substrate, and a plurality of display devices, an encapsulation layer, a microlens array and a protective layer which are sequentially provided on the substrate, wherein the microlens array comprises a plurality of microlenses corresponding to the plurality of display devices, and each microlens in the microlens array comprises a multi-step structure having a plurality of steps, wherein a bottom of the multi-step structure faces the plurality of display devices so that light emitted by the pluarity of display devices irrdiates on the bottom of the multi-step structure to be converged by the multi-step structure; and a phase difference between a highest point and a lowest point of the multi-step structure is $(2\pi/\lambda)$ $(n1-n0)$ h, where $\lambda$ represents a wavelength of an incident light, n1 represents a refractive index of the multi-step structure, n0 represents a refractive index of the protective layer, and h represents a height of the highest point of the multi-step structure.

2. The display apparatus of claim 1, wherein a thickness of the encapsulation layer is equal to a focal length of each of the plurality of microlenses.

3. The display apparatus of claim 2, wherein an orthographic projection of the microlens on the substrate is a square.

4. The display apparatus of claim 2, wherein the multi-step structure is made of a same material.

5. The display apparatus of claim 1, wherein heights of at least two steps in the multi-step structure are different from each other.

6. The display apparatus of claim 1, wherein heights of the plulriaty of steps in the multi-step structure monotonically decrease in a direction from a center to an edge of the microlens.

7. The display apparatus of claim 1, wherein the plurality of display devices each comprises a light emitting diode or an organic light emitting diode, and the protective layer is made of a transparent material.

8. The display apparatus of claim 1, wherein the encapsulation layer is made of an organic material.

9. The display apparatus of claim 8, wherein the organic material comprises resin or poly methyl methacrylate.

10. The display apparatus of claim 1, wherein an orthographic projection of the microlens on the substrate is a square.

11. The display apparatus of claim 1, wherein the multi-step structure is made of a same material.

12. The display apparatus of claim 11, wherein the same material is photoresist or silicon nitride.

13. The display apparatus of claim 1, wherein the phase difference is within $2\pi$, and the height h is not larger than $\lambda/(n1-n0)$.

14. A method for manufacturing a display apparatus, comprising:
  forming a plurality of display devices on a substrate;
  forming an encapsulation layer on the plurality of display devices;
  coating an exposure material layer on the encapsulation layer, and dividing the exposure material layer into a plurality of microlens regions corresponding to the plurality of display devices;
  dividing each of the plurality of microlens regions into a plurality of sampling regions according to a phase-transform function for the microlens; and
  forming a multi-step structure comprising a plurality of steps by performing a patterning process on the plurality of sampling regions in the microlens region,
  wherein the multi-step structure in the microlens region constitutes a microlens and a bottom of the multi-step structure faces the plurality of display devices so that light emitted by the pluarity of display devices irrdiates on the bottom of the multi-step structure to be converged by the multi-step structure,
  wherein after forming a multi-step structure comprising a plurality of steps by performing a patterning process on the plurality of sampling regions in the microlens region, the method further comprises: forming a protective layer on the multi-step structure; and
  a phase difference between a highest point and a lowest point of the multi-step structure is $(2\pi/\lambda)$ $(n1-n0)$ h, where $\lambda$ represents a wavelength of an incident light, n1 represents a refractive index of the multi-step structure, n0 represents a refractive index of the protective layer, and h represents a height of the highest point of the multi-step structure.

15. The method of claim 14, wherein the patterning process is an overlay lithography process, and forming a multi-step structure comprising a plurality of steps by performing a patterning process on the plurality of sampling regions in the microlens region comprises:
  aligning patterns of a plurality of preset mask plates with the plurality of sampling regions in sequence; and
  exposing, developing, and etching the exposure material layer in each of the plurality of microlens regions to form the multi-step structure comprising the plurality of steps.

16. The method of claim 15, wherein a relationship between the number of the plurality of preset mask plates and the number of steps in the multi-step structure satisfies: $L=2^n$, where L represents the number of steps in the multi-step structure, and n represents the number of the plurality of preset mask plates.

17. The method of claim 14, wherein dividing each of the plurality of microlens regions into a plurality of sampling regions according to a phase-transform function for the microlens comprises:
  uniformly sampling the microlens region at an equal interval in a row direction and in a column direction, according to the phase-transform function for the microlens, to form the plurality of the sampling regions.

18. The method of claim 14, wherein the encapsulation layer is made of an organic material.

19. The method of claim 18, wherein the organic material comprises resin or poly methyl methacrylate.

20. The method of claim 14, wherein the phase difference is within $2\pi$, and the height h is not larger than $\lambda/(n1-n0)$.

* * * * *